United States Patent
Hu et al.

(10) Patent No.: US 11,825,654 B2
(45) Date of Patent: Nov. 21, 2023

(54) MEMORY DEVICE

(71) Applicant: MACRONIX INTERNATIONAL CO., LTD., Hsinchu (TW)

(72) Inventors: Chih-Wei Hu, Miaoli County (TW); Teng-Hao Yeh, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 389 days.

(21) Appl. No.: 17/113,190

(22) Filed: Dec. 7, 2020

(65) Prior Publication Data
US 2022/0181347 A1    Jun. 9, 2022

(51) Int. Cl.
*H10B 43/27* (2023.01)
*H01L 21/768* (2006.01)
*G11C 16/08* (2006.01)

(52) U.S. Cl.
CPC ............ *H10B 43/27* (2023.02); *G11C 16/08* (2013.01); *H01L 21/76885* (2013.01)

(58) Field of Classification Search
CPC .... H10B 43/27; G11C 16/08; H01L 21/76885
See application file for complete search history.

(56) References Cited

U.S. PATENT DOCUMENTS

| | | | |
|---|---|---|---|
| 10,700,085 B2 | 6/2020 | Hwang et al. | |
| 10,854,622 B2 | 12/2020 | Yoon et al. | |
| 10,950,623 B2 | 3/2021 | Song et al. | |
| 2017/0294388 A1 | 10/2017 | Yoon et al. | |
| 2020/0051983 A1* | 2/2020 | Zhang | H10B 41/27 |
| 2020/0203366 A1 | 6/2020 | Kim et al. | |
| 2020/0251491 A1* | 8/2020 | Ozawa | H10B 43/10 |
| 2022/0084946 A1* | 3/2022 | Park | H10B 43/27 |

(Continued)

FOREIGN PATENT DOCUMENTS

| | | |
|---|---|---|
| CN | 107644875 A | 1/2018 |
| CN | 108666319 A | 10/2018 |
| CN | 109326606 A | 2/2019 |

(Continued)

OTHER PUBLICATIONS

Chinese Language Office Action dated Jun. 7, 2021 in corresponding Taiwan Application No. 109143041.

*Primary Examiner* — Michael Lebentritt
(74) *Attorney, Agent, or Firm* — McClure, Qualey & Rodack, LLP (57) ABSTRACT

A memory device includes a stacked structure and at least one first element structure. The stacked structure is in a memory array region and a staircase contact region. The stacked structure includes first conductive layers and a second conductive layer arranged in a longitudinal direction. The memory array region and the staircase contact region are arranged in a first lateral direction. The at least one first element structure passes through the first conductive layers and the second conductive layer along the longitudinal direction. The first conductive layers surround a sidewall surface of the at least one first element structure. The second conductive layer includes conductive portions arranged in a second lateral direction. The conductive portions are completely separated from each other by the at least one first element structure. The first lateral direction is different from the second lateral direction.

20 Claims, 9 Drawing Sheets

(56) References Cited

U.S. PATENT DOCUMENTS

| | | | | |
|---|---|---|---|---|
| 2022/0148919 A1* | 5/2022 | Hung | ................... | H10B 43/27 |
| 2022/0302045 A1* | 9/2022 | Kawamura | ............ | H10B 43/50 |

FOREIGN PATENT DOCUMENTS

| | | | | | |
|---|---|---|---|---|---|
| JP | 2018037513 A | * | 3/2018 | ....... | H01L 21/76816 |
| JP | 2019161162 A | * | 9/2019 | ......... | H01L 23/5226 |
| JP | 2020027873 A | * | 2/2020 | ............ | H01L 23/52 |
| TW | 202023030 A | | 6/2020 | | |

\* cited by examiner

MEMORY DEVICE

BACKGROUND

Technical Field

The present invention relates to a memory device, and more particularly to a three dimensional memory device.

Description of the Related Art

Recently, memory devices have become smaller in size. In the memory technology, shrinking of feature sizes, and improving operation speed, efficiency, density, and cost per Integrated circuit are important objectives. For satisfy customer need and the market demand, it is important to shrink devices in size and also to maintain the electricity of devices.

SUMMARY

The present invention relates to a memory device.

According to one aspect of the present disclosure, a memory device is provided. The memory device includes a stacked structure and at least one first element structure. The stacked structure is in a memory array region and a staircase contact region. The stacked structure includes first conductive layers and a second conductive layer arranged in a longitudinal direction. The memory array region and the staircase contact region are arranged in a first lateral direction. The at least one first element structure passes through the first conductive layers and the second conductive layer along the longitudinal direction. The first conductive layers surround a sidewall surface of the at least one first element structure. The second conductive layer includes conductive portions arranged in a second lateral direction. The conductive portions are completely separated from each other by the at least one first element structure. The first lateral direction is different from the second lateral direction.

The above and other embodiments of the disclosure will become better understood with regard to the following detailed description of the non-limiting embodiment(s). The following description is made with reference to the accompanying drawings.

DETAILED DESCRIPTION

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

The ordinal numbers, such as "the first", "the second", and "the third", are used in the specification and the claims for modifying claim elements only, neither implying nor indicating that the claim elements have any previous ordinal numbers. The ordinal numbers do not indicate the sequence between one claim element and another claim element or the sequence in the manufacturing method. The ordinal numbers are used for clearly differentiating two claim elements having the same designation.

Figure 1A:
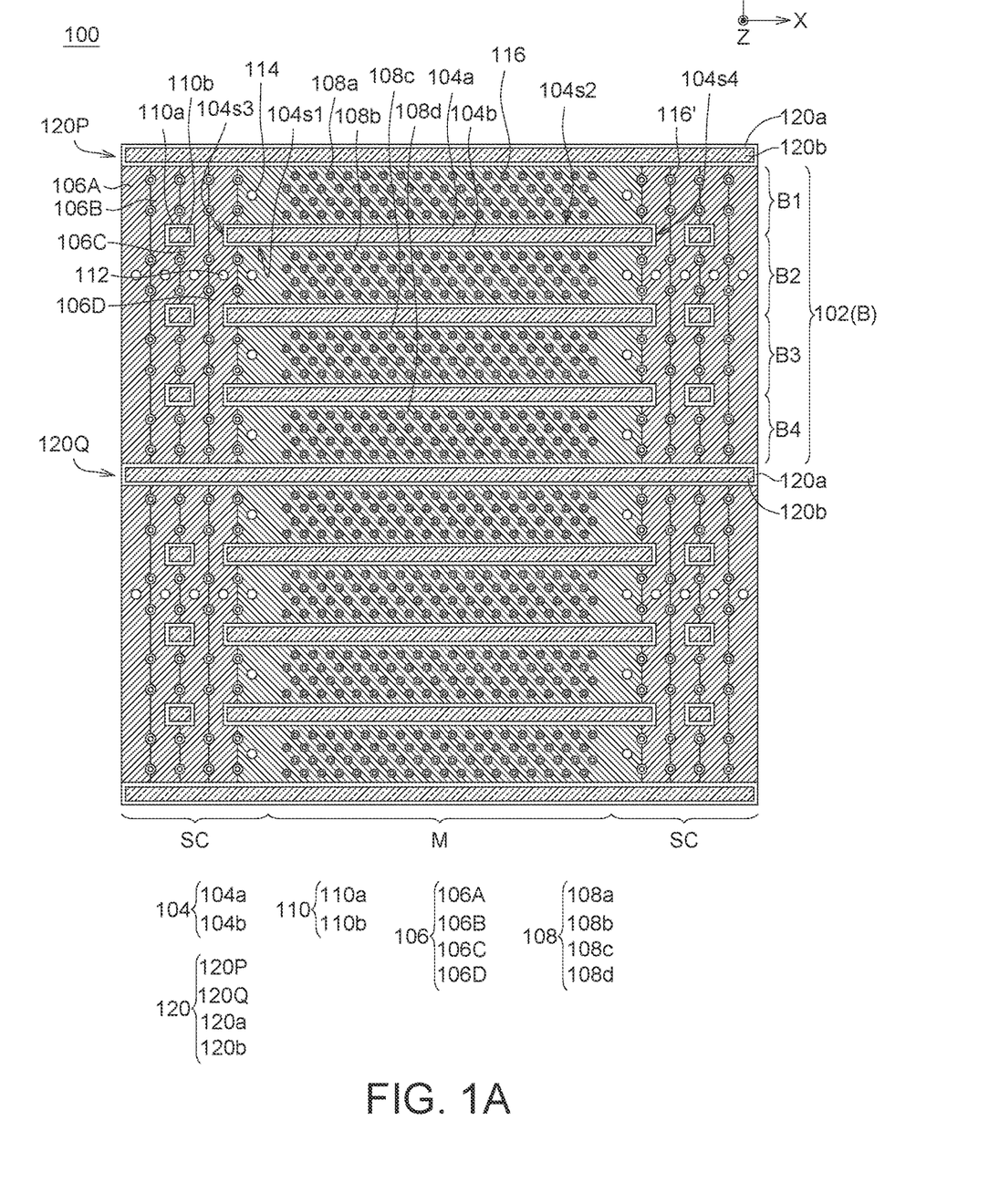
FIG. 1A illustrates a top view of a memory device according to an embodiment.
Figure 1B:
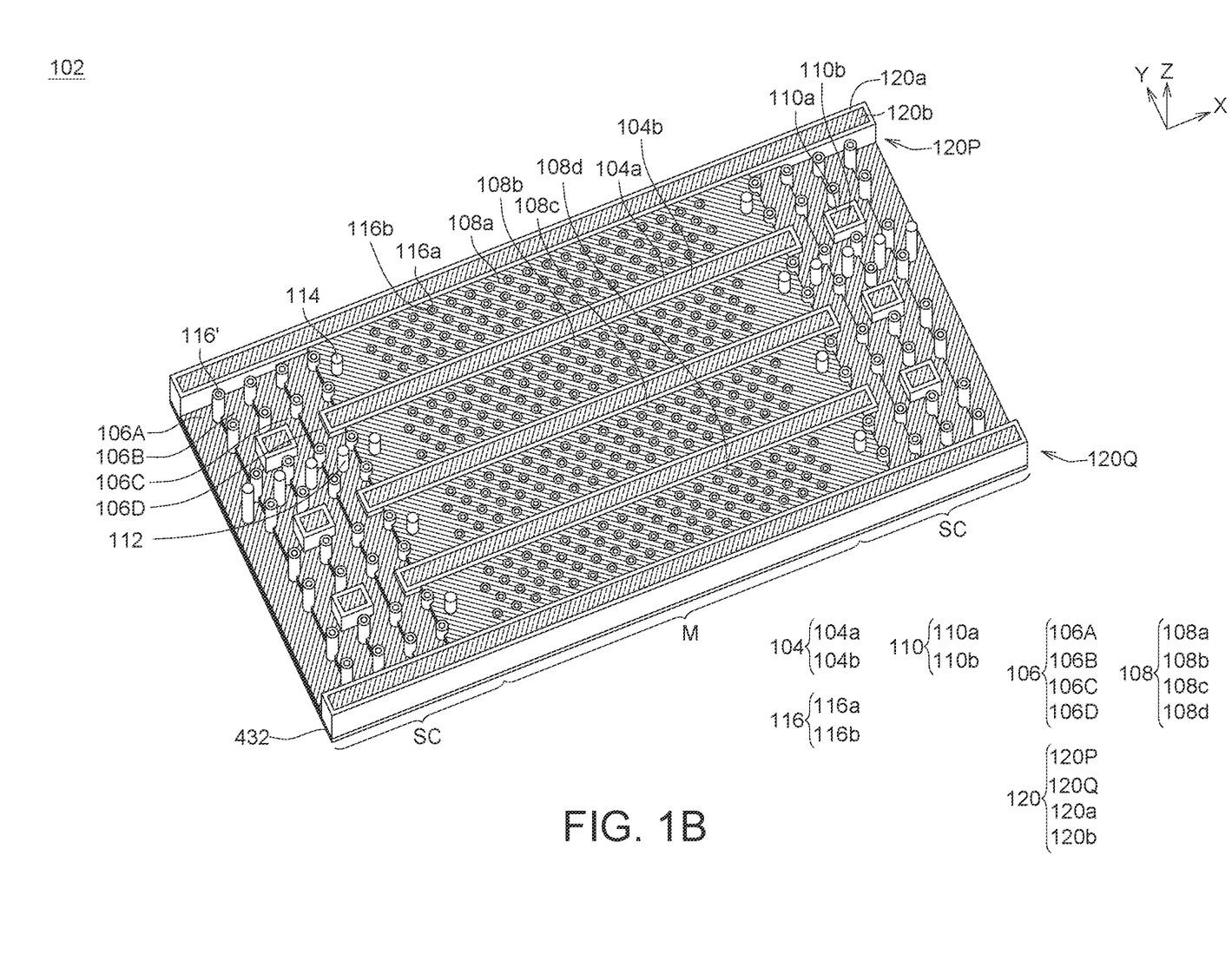
FIG. 1B illustrates a stereoscopic schematic diagram of a stacked structure of the memory device of FIG. 1A.

FIG. 1A illustrates a top view of a memory device 100 according to an embodiment. FIG. 1B illustrates a stereoscopic schematic diagram of a stacked structure 102 of the memory device 100 of FIG. 1A.

FIG. 1A and FIG. 1B are referred to. The memory device 100 may comprise a stacked structure 102 and a first element structure 104. For instance, the memory device 100 may comprise a NAND flash memory.

Figure 3:
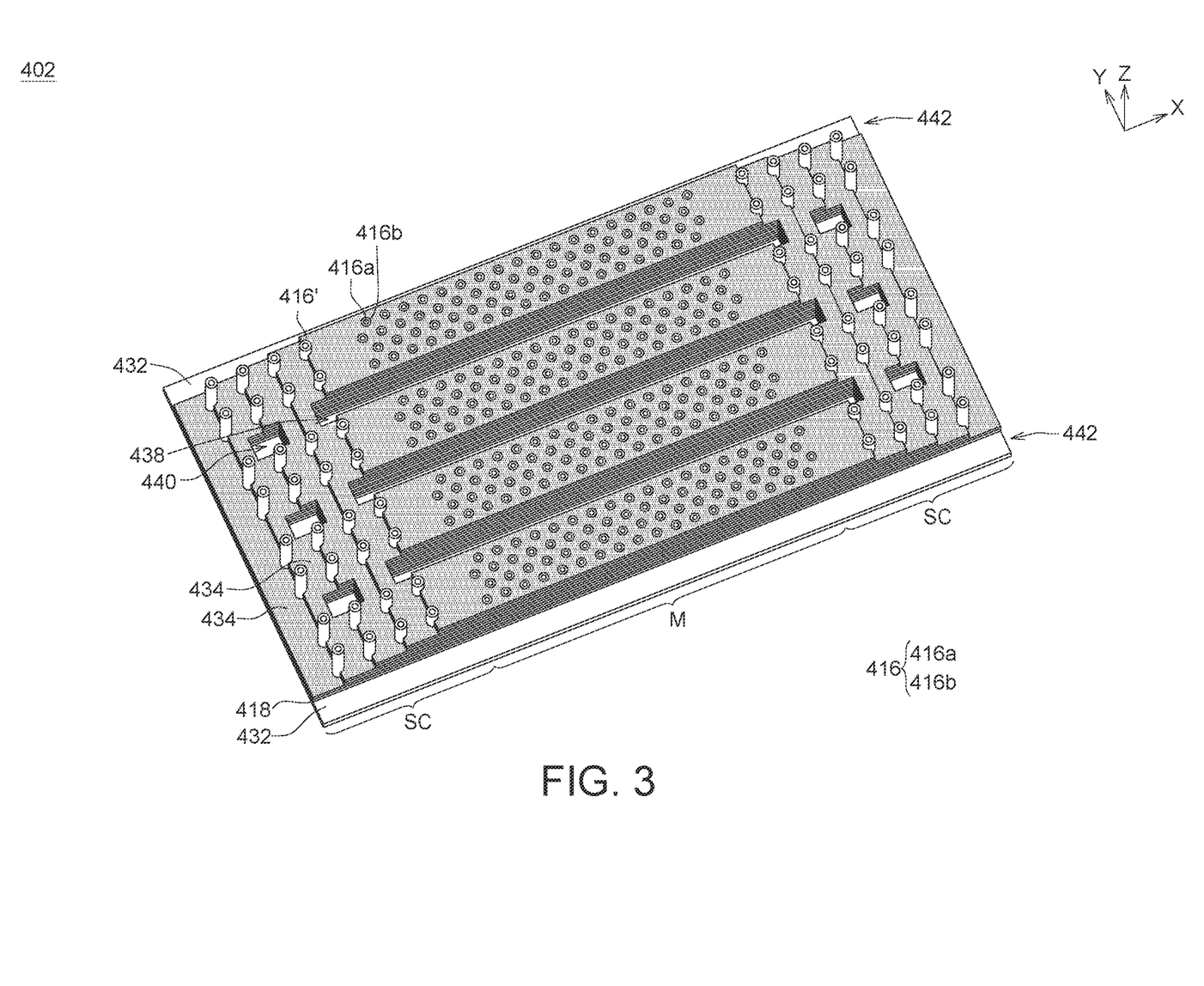
FIG. 3 to FIG. 7 illustrate a method for manufacturing the memory device according to an embodiment.
Figure 4:
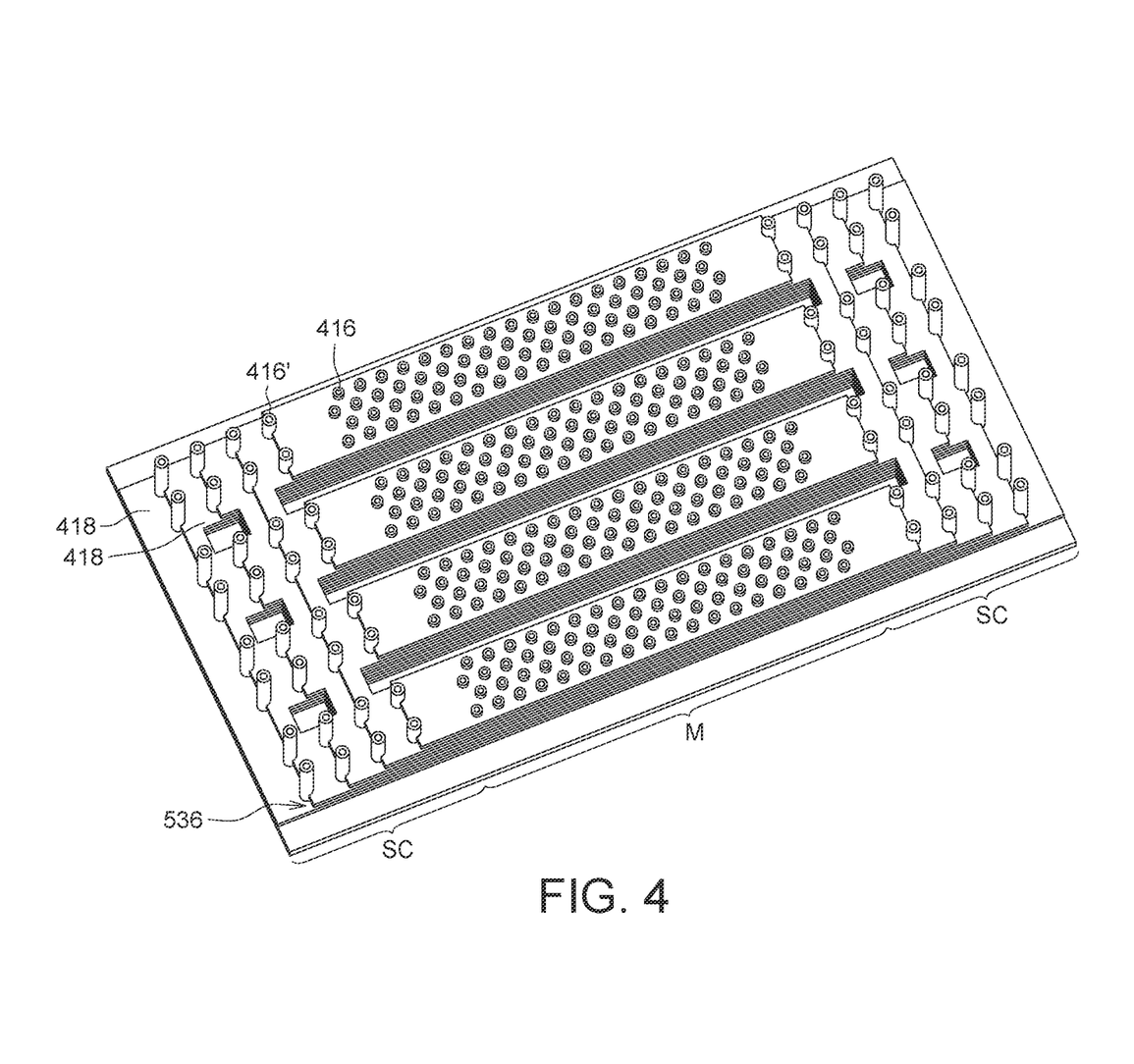

The stacked structure 102 is in a memory array region M and a staircase contact region SC. The memory array region M and the staircase contact region SC are arranged in a first lateral direction X. The stacked structure 102 comprises conductive layers and insulating layers (insulating layers 418, as shown in FIG. 4) alternately stacked on a substrate 432 (as shown in FIG. 1B and FIG. 3) in a longitudinal direction Z (such as a vertical direction). The conductive layers comprise first conductive layers 106 (such as first conductive layers 106A-106D) and a second conductive layer 108. The second conductive layer 108 is above the first conductive layers 106. For instance, the substrate 432 may comprise a semiconductor material, such as silicon or polysilicon, but the present disclosure is not limited thereto. A lower level of the stacked structure 102 (or a lower stair level of the stacked structure 102 in the staircase contact region SC) may comprise the first conductive layer 106 and an insulating layer 418 under the first conductive layer 106. An upper level of the stacked structure 102 (or an upper stair level of the stacked structure 102 in the staircase contact region SC) may comprise the second conductive layer 108 and an insulating layer 418 under the second conductive layer 108.

The first element structure 104 extends in the first lateral direction X. The first element structure 104 may comprise an insulating wall 104a and a conductive element 104b. The insulating wall 104a has an enclosed rectangular shape. The insulating wall 104a surrounds the conductive element 104b. The conductive element 104b is electrically insulated from the first conductive layers 106A-106D and the second conductive layer 108 by the insulating wall 104a. In one embodiment, the conductive element 104b may serve as a common source line (CSL). For instance, the conductive element 104b may comprise a conductive material, such as tungsten (W), but the present disclosure is not limited thereto.

The insulating wall 104a of the first element structure 104 comprises a first sidewall surface 104s1, a second sidewall surface 104s2, a third sidewall surface 104a3 and a fourth sidewall surface 104s4, The second sidewall surface 104s2 is opposite to the first sidewall surface 104s1. The third sidewall surface 104s3 is between the first sidewall surface 104s1 and the second sidewall surface 104s2. The fourth sidewall surface 104s4 is opposite to the third side all surface 104s3. The fourth sidewall surface 104s4 is between the first sidewall surface 104s1 and the second sidewall surface 104s2.

The insulating layers 418 (as shown in FIG. 4) surround a sidewall surface of the first element structure 104. The insulating layers 418 may surround the first sidewall surface 104s1, the second sidewall surface 104s2, the third sidewall surface 104s3 and the fourth sidewall surface 104s4 of the insulating wall 104a of the first element structure 104.

The second conductive layer 108 comprises conductive portions (such as conductive portions 108a-108d) arranged in a second lateral direction Y. The conductive portions 108a-108d are completely separated from each other by the first element structure 104. The conductive portions (such as the conductive portions 108a-108d) are above the first conductive layers 106 (such as the first conductive layers 106A-106D). The first lateral direction X may be substantially perpendicular to the second lateral direction Y.

The first conductive layers 106 comprise word lines (WL) and a ground select line (GSL). In one embodiment, the first conductive layer 106A serves as the ground select line, the first conductive layers 106B-106D serve as the word lines, and the conductive portions (such as the conductive portions 108a-108d) of the second conductive layer 108 serves as the string select lines (SSL). The first conductive layers 106B-106D serving as the word lines are between the first conductive layer 106A serving as the ground select line and the conductive portions 108a-108d serving as the string select lines. The drawing illustrates only three word lines (the first conductive layers 106B-106D), but the present invention is not limited thereto. It can be configured more word lines between the ground select line (the first conductive layer 106A) and the string select lines (the conductive portions).

The first element structure 104 passes through the first conductive layers 106, the second conductive layer 108 and the insulating layers 418 in the memory array region M along the longitudinal direction Z. The first element structure 104 may extend to a portion of the staircase contact region SC. The first element structure 104 may pass through a portion of the first conductive layers 106 and the insulating layers 418 in the staircase contact region SC in the longitudinal direction Z.

Figure 1C:
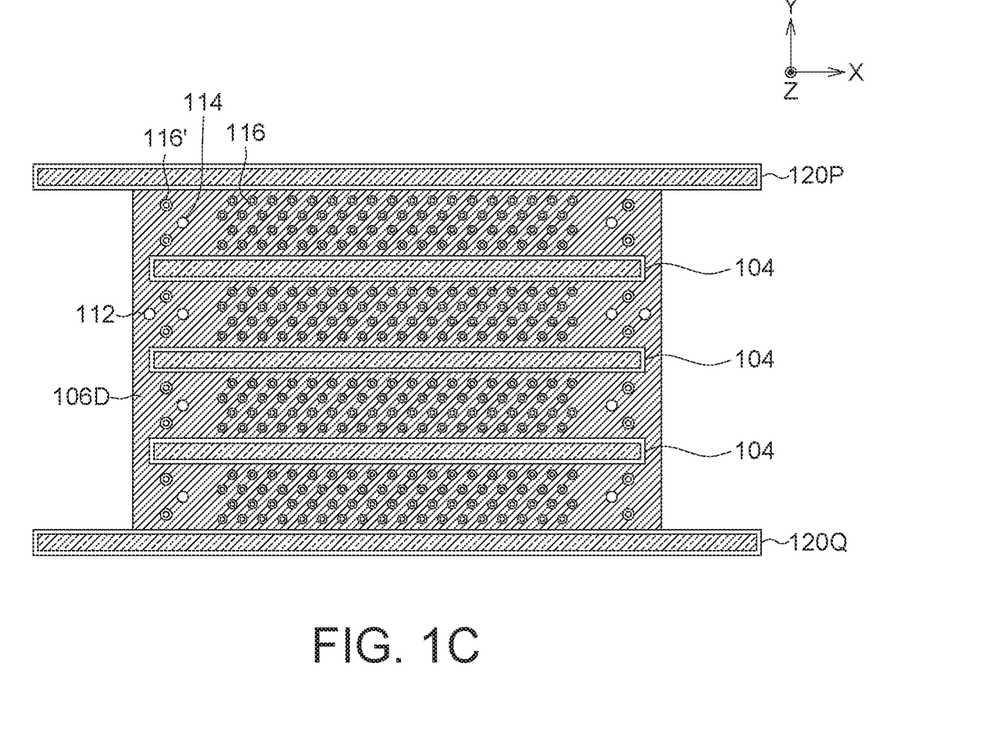
FIG. 1C illustrates a lateral cross-section view of the first conductive layer and the other elements corresponding to the first conductive layer of the memory device of FIG. 1A.

FIG. 1C illustrates a lateral cross-section view of the first conductive layer 106D and the other elements corresponding to the first conductive layer 106D of the memory device 100 of FIG. 1A.

FIG. 1A to FIG. 1C are referred to. The first conductive layers 106 surround a sidewall surface of the first element structure 104. The first conductive layers 106 may surround the first sidewall surface 104s1, the second sidewall surface 104s2, the third sidewall surface 104s3 and the fourth sidewall surface 104s4 of the first element structure 104. The first conductive layers 106 (such as the first conductive layers 106A-106D) are in direct contact with the first sidewall surface 104s1 the second sidewall surface 104s2, the third sidewall surface 104s3 and the fourth sidewall surface 104s4 of the insulating wall 104a.

The conductive portion 108a and conductive portion 108b of the second conductive layer 108 are respectively on the second sidewall surface 104s2 and first sidewall surface 104s1 of the first element structure 104.

FIG. 1A and FIG. 1B are referred to. In one embodiment, the memory device 100 may optionally comprise a second element structure 110. In another embodiment, the memory device 100 may omit the second element structure 110.

The second element structure 110 may comprise an insulating wall 110a and a conductive element 110b. The second element structure 110 is in the staircase contact region SC. The first element structure 104 is separated from the second element structure 110. The second element structure 110 passes through the first conductive layers 106A-106C and the insulating layers 418 in the staircase contact region SC along the longitudinal direction Z. The insulating wall 110a has an enclosed rectangular shape. The insulating wall 110a surrounds the conductive element 110b. The conductive element 110b of the second element structure 110 is electrically insulated from the first conductive layers 106 by the insulating wall 110a. For instance, the conductive element 110b may comprise a conductive material, such as tungsten (W), but the present disclosure is not limited thereto.

FIG. 1A and FIG. 1B are referred to. The memory device 100 may further comprise a conductive pillar 112 and a contact pillar 114.

The conductive pillars 112 and contact pillars 114 are in the staircase contact region SC. The conductive pillars 112 are electrically connected on the first conductive layers 106. The contact pillars 114 are electrically connected on the conductive portions (such as the conductive portions 108a-108d) of the second conductive layer 108. A longitudinal size of the conductive pillar 112 is greater than a longitudinal size of the contact pillar 114. An amount of the contact pillars 114 electrically connected to the second conductive layer 108 may be different from an amount of a portion of the conductive pillars 112 electrically connected to one first conductive layer 106 (such as one first conductive layer of the first conductive layers 106A-106D). In one embodiment, the amount of the contact pillars 114 electrically connected to the second conductive layer 108 (for example, the amount is 4, as shown in FIG. 1A and FIG. 1B) may be greater than the amount of the conductive pillar 112 electrically connected to one of the first conductive layers 106 (for example, the conductive pillar amount is 1, as shown in FIG. 1A and FIG. 1B). In another embodiment, the amount of the conductive pillars 112 electrically connected to one of the first conductive layers 106 may also be other suitable amount.

According to the present embodiment, since the amount of the conductive pillar 112 electrically connected to one of the first conductive layers 106 (such as one first conductive layer of the first conductive layers 106A-106D) is smaller than the amount of the contact pillars 114 electrically connected to the second conductive layer 108, the amount of the conductive pillars 112 may be further lowered, thereby having the advantages of process simplification and reducing manufacturing cost.

FIG. 1A and FIG. 1B are referred to. The memory device 100 may further comprise a pillar element 116 and a pillar element 116'.

The pillar elements 116 are in the memory array region M. The pillar element 116 may comprise a channel pillar 116a and a memory material layer 116b. The memory material layer 116b is on a sidewall surface of the channel pillar 116a. The pillar element 116 may pass through the stacked structure 102 to the lowest level in the longitudinal direction Z. An upper end of the channel pillar 116a may be electrically connected to a bit line (BL). A lower end of the channel pillar 116a may be electrically connected to a common source line (CSL) through the substrate 432. The channel pillar 116a may also be referred to as an active pillar. The channel pillars 116a are in the memory array region M and pass through the stacked structure 102. Memory cells are defined in the memory material layer 116b at intersections between the first conductive layers 106 (such as the first conductive layers 106B-106D) serving as the word lines and the channel pillars 116a.

The pillar elements 116' are in the staircase contact region SC, The pillar element 116' may comprise a channel pillar and a memory material layer. The memory material layer is on a sidewall surface of the channel pillar. The pillar elements 116' may pass through the stacked structure 102 to the lowest stair level in the longitudinal direction Z. The pillar element 116' (channel pillar) may be electrically floating and serve as a dummy pillar element. In one embodiment, a material set of the pillar element 116' is identical to a material set of the pillar element 116. In another embodiment, a material set of the pillar element 116' is different from a material set of the pillar element 116.

FIG. 1A and FIG. 1B are referred to. The memory device 100 may further comprise a third element structure 120 (such as a third element structure 120P and a third element structure 120Q).

The third element structure 120 may comprise an insulating wall 120a and a conductive element 120b. The third element structure 120 passes through the memory array region M and the staircase contact region SC along the first lateral direction X. The insulating wall 120a has an enclosed rectangular shape. The insulating wall 120a surrounds the conductive element 120b. The conductive element 120b is electrically insulated from the first conductive layers 106A-106D and the second conductive layer 108 by the insulating wall 120a.

Memory cells of one block B (or one memory block) in the stacked structure 102 and the memory array region M are between the third element structure 120P and the third element structure 120Q. The memory cells of one block B may be selected, controlled, or simultaneously erased by corresponding one word line driver (not shown). Two memory blocks are shown in FIG. 1A. One memory block is shown in FIG. 1B.

One block B comprises memory cells of sub-blocks (such as four sub-blocks B1-B4). The memory cells of sub-blocks B1-B4 are respectively on two sides of the first element structure 104. The memory cells of one sub-block (or one sub memory block) may be controlled to be selected/unselected by corresponding one string select line (one of the conductive portions 108a-108d). For instance, the conductive element 120b may comprise a conductive material, such as tungsten (W), but the present disclosure is not limited thereto.

A length of the first element structure 104 in the first lateral direction X is smaller than a length of the third element structure 120 in the first lateral direction X. A length of the second element structure 110 in the first lateral direction X is smaller than the length of the third element structure 120 in the first lateral direction X.

Figure 2:
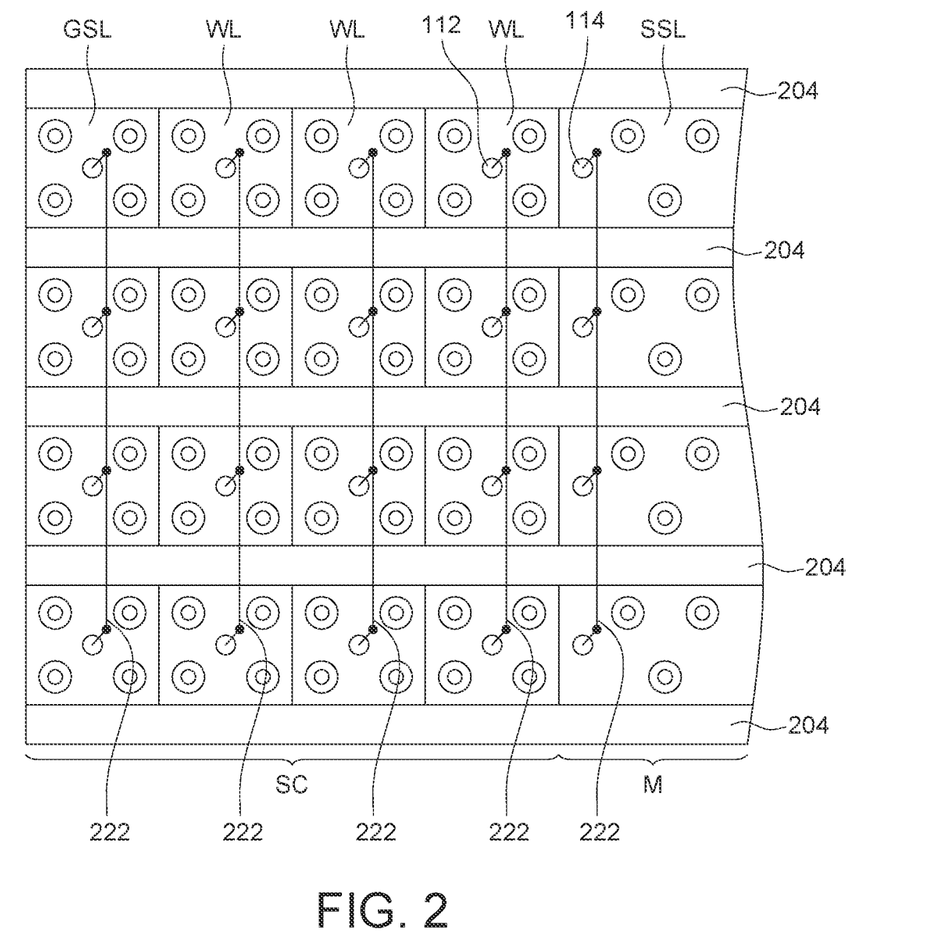
FIG. 2 illustrates a top view of a portion of a memory device corresponding to one memory block in a comparison example.

FIG. 2 is referred to, which illustrates a top view of a portion of a memory device corresponding to one memory block in a comparison example. A dielectric element 204 extends and passes through ground select lines GSL, word lines WL and string select lines SSL corresponding to sub memory blocks of the stacked structure in the memory array region M and the staircase contact region SC. Each of the word lines WL and the ground select lines GSL which are electrically insulated from each other by the dielectric elements 204 has one conductive pillar 112 thereon. The conductive pillars 112 electrically connected to word lines WL (or ground select lines GSL) of the same levels are electrically connected to each other by a conductive element 222 (for example, comprising a metal layer, such as a zero metal layer (ML0)) extended over the dielectric element 204. As shown in the comparison example of FIG. 2, the amount of the conductive pillars 112 on the word lines WL (or the ground select lines GSL) of the same level corresponding to one memory block is four, which is identical to an amount of the contact pillars 114 (i.e. four contact pillars 114) electrically connected to the string select lines SSL.

Compared with the comparison example, in the memory device corresponding to one memory block in the embodiment of present disclosure, an amount of the conductive pillar 112 (for example, the amount is one, as shown in FIGS. 1A and 1B) electrically connected to one of the first conductive layers 106 (i.e. one word line or one ground select line) is smaller than an amount of the contact pillars 114 (for example, the amount is four, as shown in FIGS. 1A and 1B) electrically connected to the second conductive layer 108 (string select line). In other words, the memory device corresponding to one memory block may have a relatively small amount of the conductive pillars 112. In addition, in the embodiment of the present disclosure, there is no need to dispose the conductive elements 222 as shown in the comparison example, which are extended above the dielectric elements 204 and configured to be electrically connected to the word lines WL of an identical level. Accordingly, the memory device of the embodiment of the present disclosure can have simpler process, larger process window and lower manufacturing cost.

FIG. 3 to FIG. 7 illustrate a method for manufacturing the memory device according to an embodiment.

FIG. 3 is referred to. Insulating layers 418 and insulating films 434 are alternately stacked on a substrate 432, so as to form a stacked structure 402. For instance, the substrate 432 may comprise a semiconductor material, such as silicon or poly-silicon, but the present disclosure is not limited thereto. In one embodiment, a material of the insulating layer 418 is different from a material of the insulating film 434. The insulating layer 418 may comprise an oxide, such as silicon oxide, but the present disclosure is not limited thereto. The insulating film 434 may comprise a nitride, such as silicon nitride, but the present disclosure is not limited thereto. Other insulating materials may also be used in the insulating layer 418 and the insulating film 434. A thickness of the staircase contact region SC may be thinned by using a photolithography etching method from a top surface of the stacked structure 402. In one embodiment, an insulating element (may comprise an oxide, such as silicon oxide, not shown) may be formed on the memory array region M and the staircase contact region SC of the stacked structure 402. For instance, the insulating element (not shown) on the stacked structure 402 may be flattened by a CMP step.

In one embodiment, the pillar element 416 and the pillar element 416' respectively passing through the memory array region M and the staircase contact region SC of the stacked structure 402 are formed. The pillar element 416 and the pillar element 416' may also pass through the insulating element (not shown) on the stacked structure 402. In another embodiment, the pillar element 416 and the pillar element 416' may be formed by a method comprising forming an opening in the stacked structure 402 and the insulating element (not shown) by a photolithography etching step, and then filling the opening with a proper pillar material. The pillar element 416 and the pillar element 416' may be formed simultaneously, and may comprise the channel pillar 416a and the memory material layer 416b. The memory material layer 416b is formed on a sidewall surface of the opening. The memory material layer 416b may comprise any kind of charge trapping structure, such as an ONO structure, an ONONO structure, an ONONONO structure, or BB-SONOS structure, etc. For instance, a charge trapping layer may use a nitride (such as silicon nitride), or other high-K materials comprising a metal oxide such as $Al_2O_3$, $HfO_2$, and the like. The channel pillar 416a is formed in the opening. In a further embodiment, the pillar element 416 and the pillar element 416' may be formed individually using different process steps. The pillar element 416 and the pillar element 416' may have different material sets.

In one embodiment, openings 438 and openings 442 may be formed in the stacked structure 402 by using a photolithography etching method. Furthermore, openings 440 are formed in the stacked structure 402 in the staircase contact region SC. A bottom of the opening 438 and a bottom of the opening 440 may expose a top surface of the substrate 432.

FIG. 4 is referred to. The insulating films 434 (may comprise a nitride, such as silicon nitride) of the memory array region M and the staircase contact region SC of the stacked structure 502 may be removed with using a selective etching step, thereby forming slits 536 between the insulating layers 418 (may comprise an oxide, such as silicon oxide). In one embodiment, the etching step may comprise a wet etch method, for example using a hot phosphoric acid, or other suitable etch methods. The slits 536 expose a sidewall surface of the pillar element 416 and a sidewall surface of the pillar element 416'. The pillar elements 416 and the pillar elements 416' exposed by the slits 536 can steadily support the insulating layers 418 exposed by the slits 536.

Figure 5:
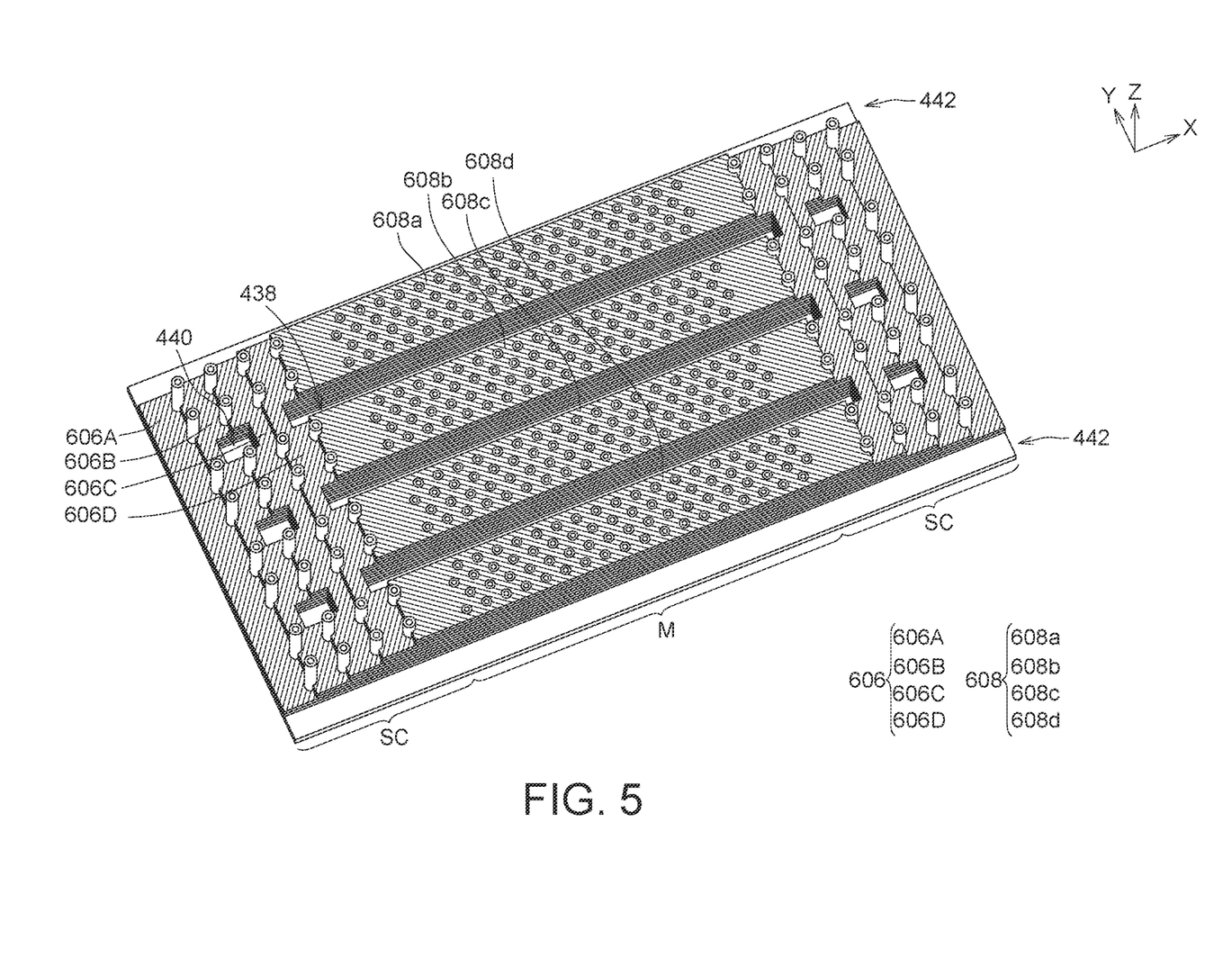

FIG. 5 is referred to. In one embodiment, conductive materials (for example, may comprise tungsten) are filled in the slits 536 so as to form conductive layers, comprising first conductive layers 606 (for example, comprising first conductive layers 606A-606D) and a second conductive layer 608 (for example, comprising conductive portions 608a-608d). In another embodiment, deposit an oxide (such as $Al_2O_3$) in the slits 536, and then fill conductive materials (for example, may comprise tungsten) in the slits 536 so as to form conductive layers, comprising first conductive layers 606 (for example, comprising first conductive layers 606A-606D) and a second conductive layer 608 (for example, comprising conductive portions 608a-608d).

Figure 6:
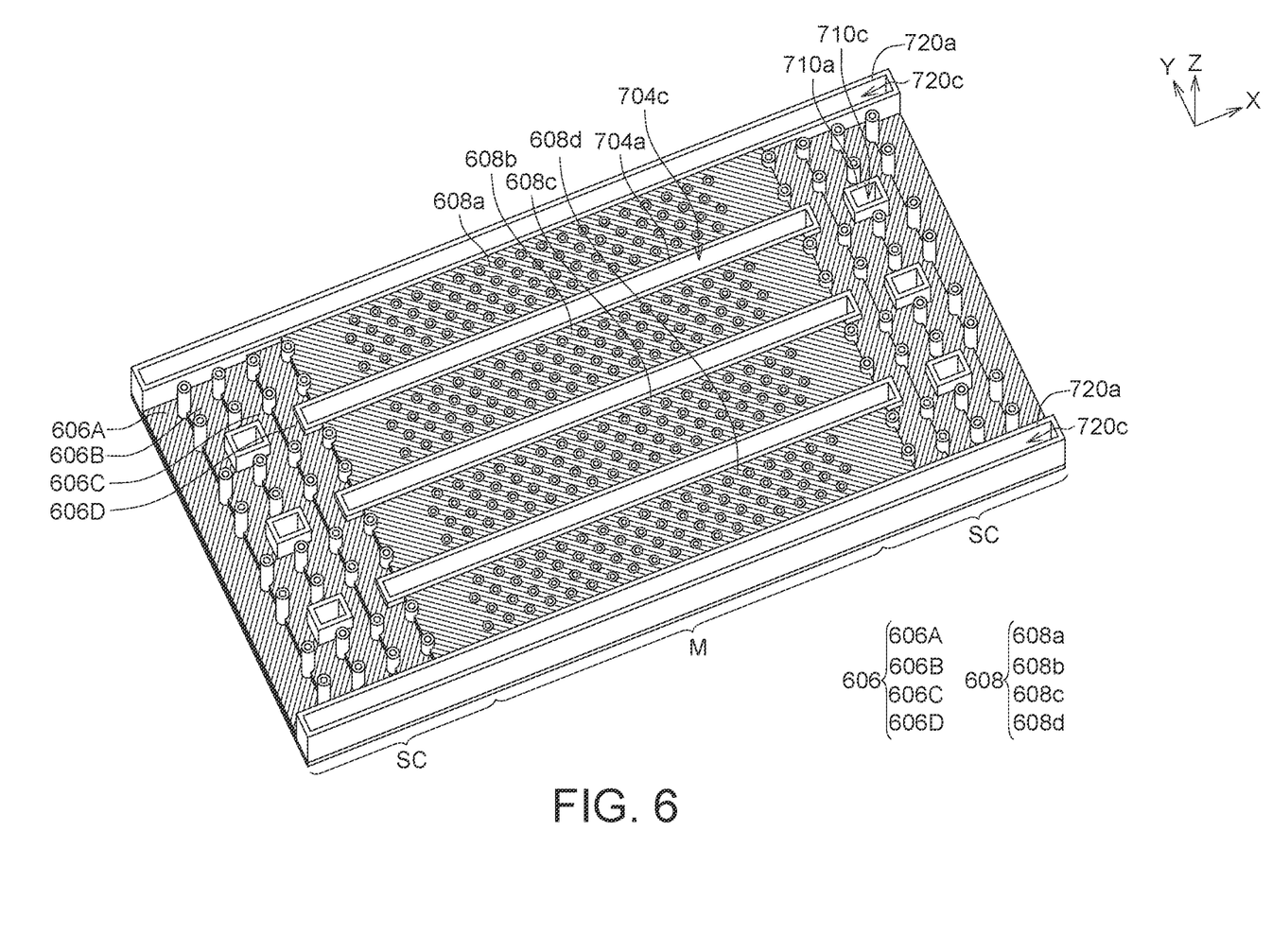

FIG. 6 is referred to. Insulating materials are formed on sidewall surfaces of the openings 438, the openings 440 and the openings 442 so as to form an insulating wall 704a, an insulating wall 710a and an insulating wall 720a, respectively. For instance, the insulating wall 704a, insulating wall 710a and insulating wall 720a may comprise an oxide, such as silicon oxide, but the present disclosure is not limited thereto.

Figure 7:
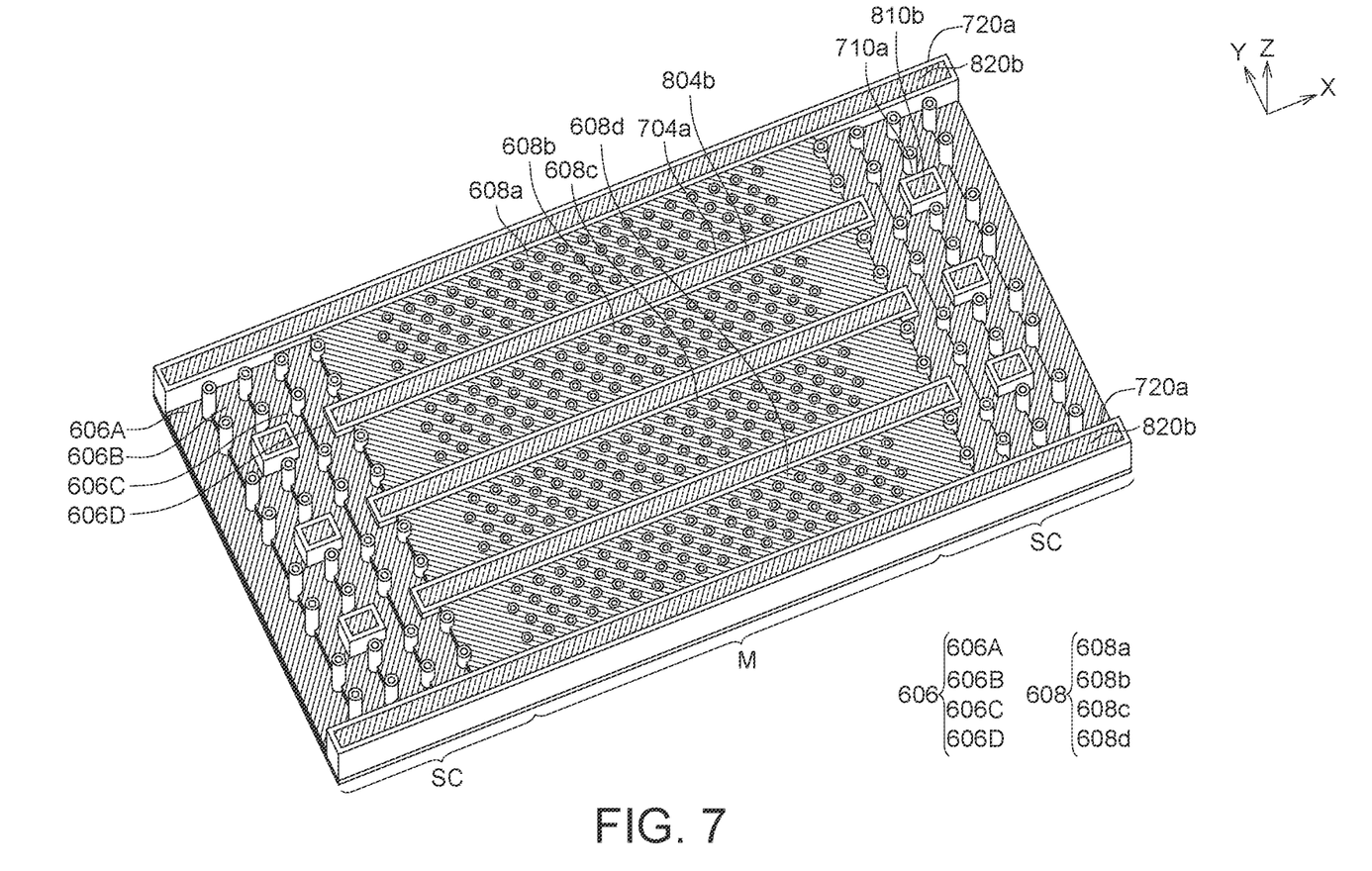

FIG. 7 is referred to. Conductive materials are filled in openings 704c, openings 710c and openings 720c respectively surrounded by the insulating wall 704a, insulating wall 710a and insulating wall 720a, so as to form conductive elements 804b, conductive elements 810b and conductive elements 820b, respectively.

FIG. 1A and FIG. 1B are referred to. The conductive pillars 112 and contact pillars 114 are formed, respectively landing on the first conductive layers 106 (such as the first conductive layers 106A-106D) and the second conductive layer 108. The conductive pillars 112 and contact pillars 114 may pass through the insulating element (not shown) above the staircase contact region SC. The conductive pillars 112 and contact pillars 114 may be formed by a method comprising forming a hole by using a photolithography etching process, and then filling the hole with a conductive material.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device comprising one block, the one block comprising:
   a stacked structure in a memory array region and a staircase contact region, the stacked structure comprising first conductive layers and a second conductive layer arranged in a longitudinal direction, wherein the second conductive layer is above the first conductive layers, the memory array region and the staircase contact region are arranged in a first lateral direction, and the second conductive layer comprises conductive portions arranged in a second lateral direction, the first lateral direction is different from the second lateral direction; and
   at least one first element structure passing through the first conductive layers and the second conductive layer along the longitudinal direction;
   a plurality of second element structures passing through at least one first conductive layer of the first conductive layers along the longitudinal direction in the staircase contact region, each of the second element structures having a rectangular shape with four sidewall surfaces;
   wherein:
   the second conductive layer does not contact with the four sidewall surfaces, and the at least one first conductive layer contacts with the four sidewall surfaces;
   the first conductive layers surround a sidewall surface of the at least one first element structure; and
   the conductive portions are completely separated from each other by the at least one first element structure.

2. The memory device according to claim 1, wherein the at least one first element structure comprises an insulating wall, the insulating wall has an enclosed rectangular shape.

3. The memory device according to claim 1, wherein the at least one first element structure comprises an insulating wall, the insulating wall comprises:
   a first sidewall surface;
   a second sidewall surface opposite to the first sidewall surface;
   a third sidewall surface between the first sidewall surface and the second sidewall surface; and
   a fourth sidewall surface opposite to the third sidewall surface, and between the first sidewall surface and the second sidewall surface.

4. The memory device according to claim 3, wherein the first conductive layers are in direct contact with the first sidewall surface, the second sidewall surface, the third sidewall surface and the fourth sidewall surface of the insulating wall.

5. The memory device according to claim 1, wherein the conductive portions of the second conductive layer are above the first conductive layers.

6. The memory device according to claim 1, wherein the at least one first element structure is separated from the second element structures.

7. The memory device according to claim 1, further comprising:

conductive pillars each landing on one of the first conductive layers, and electrically connected on the first conductive layers respectively; and contact pillars each landing on one of the conductive portions, and electrically connected on the conductive portions respectively;

wherein an amount of the contact pillars is different from a conductive pillar amount of a portion of the conductive pillars electrically connected to one of the first conductive layers.

8. The memory device according to claim 7, wherein the amount of the contact pillars is greater than the conductive pillar amount.

9. The memory device according to claim 1, further comprising:
conductive pillars electrically connected on the first conductive layers respectively; and
contact pillars electrically connected on the conductive portions respectively;
wherein sizes of the conductive pillars in the longitudinal direction are greater than sizes of the contact pillars in the longitudinal direction.

10. The memory device according to claim 1, further comprising:
a channel pillar in the memory array region and passing through the stacked structure; and
a memory material layer on a sidewall surface of the channel pillar, wherein memory cells are defined in the memory material layer at intersections between a portion of the first conductive layers and the channel pillar.

11. The memory device according to claim 1, wherein the stacked structure further comprises insulating layers arranged in the longitudinal direction, the first conductive layers are separated from the second conductive layer by the insulating layers.

12. The memory device according to claim 11, wherein the insulating layers surround the sidewall surface of the at least one first element structure.

13. The memory device according to claim 1, wherein the first conductive layers comprise word lines and a ground select line, the conductive portions serve as string select lines, the word lines are between the ground select line and the string select lines.

14. The memory device according to claim 1, wherein the at least one first element structure comprises a conductive element and an insulating wall, the insulating wall surrounds the conductive element.

15. The memory device according to claim 14, wherein the conductive element are electrically insulated from the first conductive layers and the second conductive layer by the insulating wall.

16. The memory device according to claim 14, wherein the conductive element serves as a common source line.

17. The memory device according to claim 1, further comprising:
a third element structure and another third element structure passing through the memory array region and the staircase contact region along the first lateral direction; and
memory cells of the one block in the stacked structure in the memory array region, and between the third element structure and the another third element structure, wherein the memory cells of the one block comprise memory cells of sub-blocks on two sides of the at least one first element structure respectively.

18. The memory device according to claim 17, wherein a length of the at least one first element structure in the first lateral direction is smaller than a length of the third element structure in the first lateral direction.

19. The memory device according to claim 17, wherein the third element structure passes through the first conductive layers and the second conductive layer along the longitudinal direction.

20. The memory device according to claim 17, wherein each of the third element structure and the another third element structure comprises a conductive element and an insulating wall, the insulating wall surrounds the conductive element, the conductive element is electrically insulated from the first conductive layers and the second conductive layer by the insulating wall.

* * * * *